(12) United States Patent
Lindsey, Jr. et al.

(10) Patent No.: US 7,392,732 B2
(45) Date of Patent: Jul. 1, 2008

(54) SCRIBING TOOL AND METHOD

(75) Inventors: Paul C. Lindsey, Jr., Lafayette, CA (US); Christopher K. Lindsey, Lafayette, CA (US); Jeffery D. Atkinson, Sebastopol, CA (US)

(73) Assignee: Micro Processing Technology, Inc., Lafayette, CA (US)

( * ) Notice: Subject to any disclaimer, the term of this patent is extended or adjusted under 35 U.S.C. 154(b) by 206 days.

(21) Appl. No.: 11/041,841

(22) Filed: Jan. 24, 2005

(65) Prior Publication Data

US 2006/0162172 A1 Jul. 27, 2006

(51) Int. Cl.
*B26D 3/08* (2006.01)

(52) U.S. Cl. .............................. 83/880; 83/879; 83/886; 438/460

(58) Field of Classification Search ................. 83/880, 83/879, 887, 886, 884, 665, 663; 225/94–96; 438/460
See application file for complete search history.

(56) References Cited

U.S. PATENT DOCUMENTS

| | | | |
|---|---|---|---|
| 3,094,785 A | | 6/1963 | Kulicke, Jr. |
| 3,968,712 A | * | 7/1976 | Duncan ................... 83/477.2 |
| 4,221,150 A | | 9/1980 | Bergfelt et al. |
| 4,228,711 A | * | 10/1980 | Insolio ..................... 83/881 |
| 4,383,460 A | * | 5/1983 | Schotter et al. ............ 83/886 |
| 5,304,056 A | * | 4/1994 | Fetterhoff ................. 425/304 |
| 5,331,877 A | * | 7/1994 | Ishii ........................ 83/886 |
| 5,718,615 A | * | 2/1998 | Boucher et al. ............. 451/5 |
| 5,820,006 A | | 10/1998 | Turner |
| 6,238,280 B1 | * | 5/2001 | Ritt et al. ................. 451/540 |
| 6,595,845 B1 | * | 7/2003 | Mizuno et al. ............ 451/548 |
| 6,679,243 B2 | * | 1/2004 | Sung ........................ 125/12 |
| 6,722,545 B2 | * | 4/2004 | Yuyama et al. ........... 225/96.5 |
| 6,796,212 B2 | * | 9/2004 | Maekawa et al. ........... 83/886 |

* cited by examiner

*Primary Examiner*—Boyer D. Ashley
*Assistant Examiner*—Omar Flores-Sánchez
(74) *Attorney, Agent, or Firm*—Thomas R. Lampe

(57) ABSTRACT

A scribing tool for use in semiconductor scribing apparatus includes a rotatable semiconductor wafer scribing wheel engageable with the semiconductor wafer to form a scribe line when the tool exerts pressure on the semiconductor wafer and the scribing wheel rotates. Bearings are engageable with the scribing wheel sides to resist sideways deflection during the scribing operation.

20 Claims, 4 Drawing Sheets

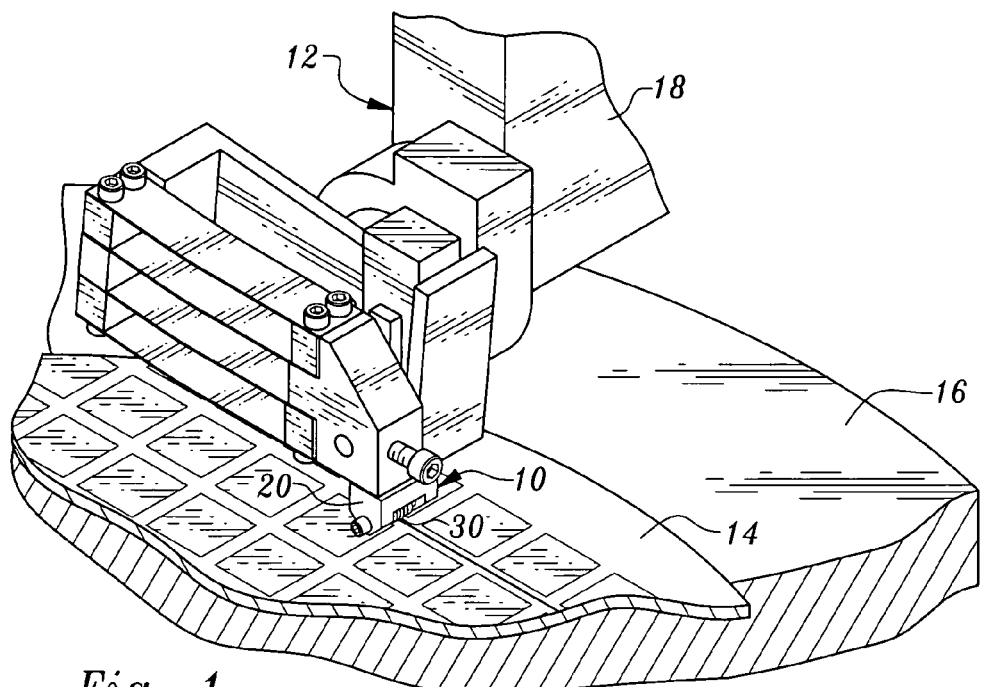
Fig. 1
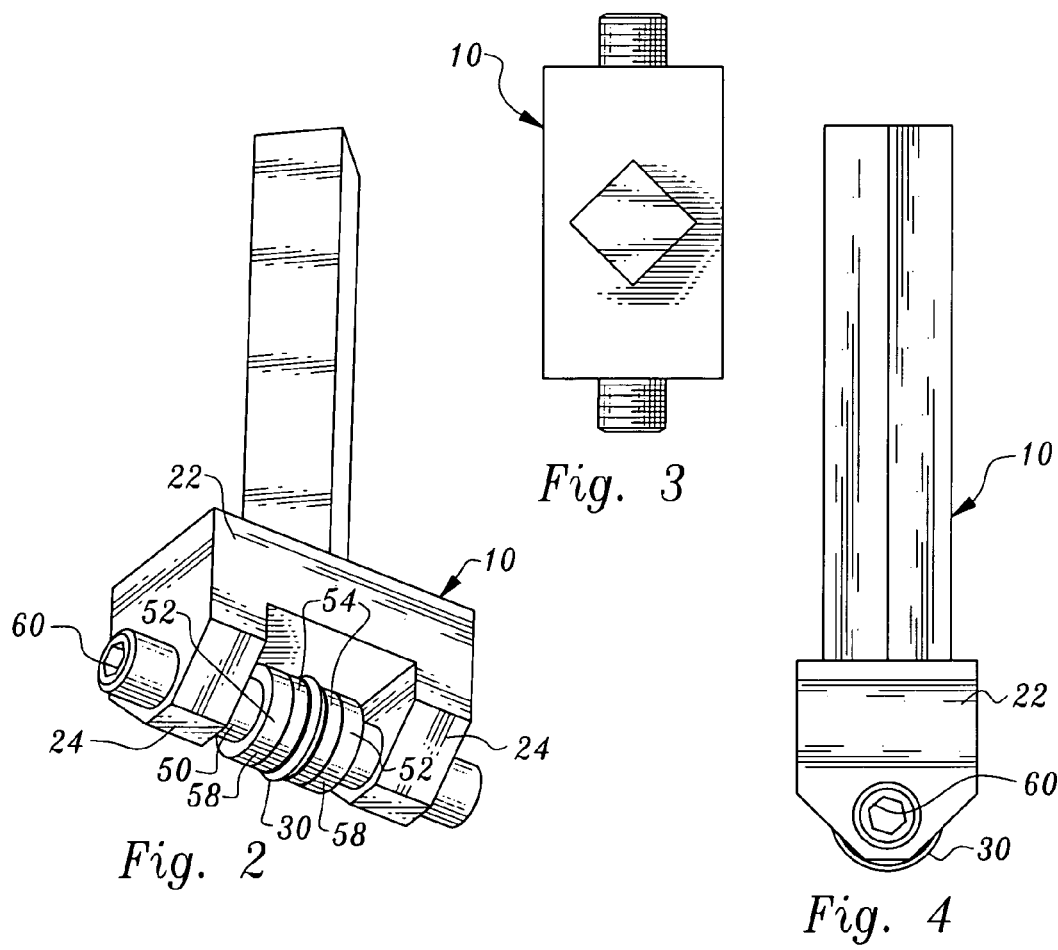
Fig. 2
Fig. 3
Fig. 4

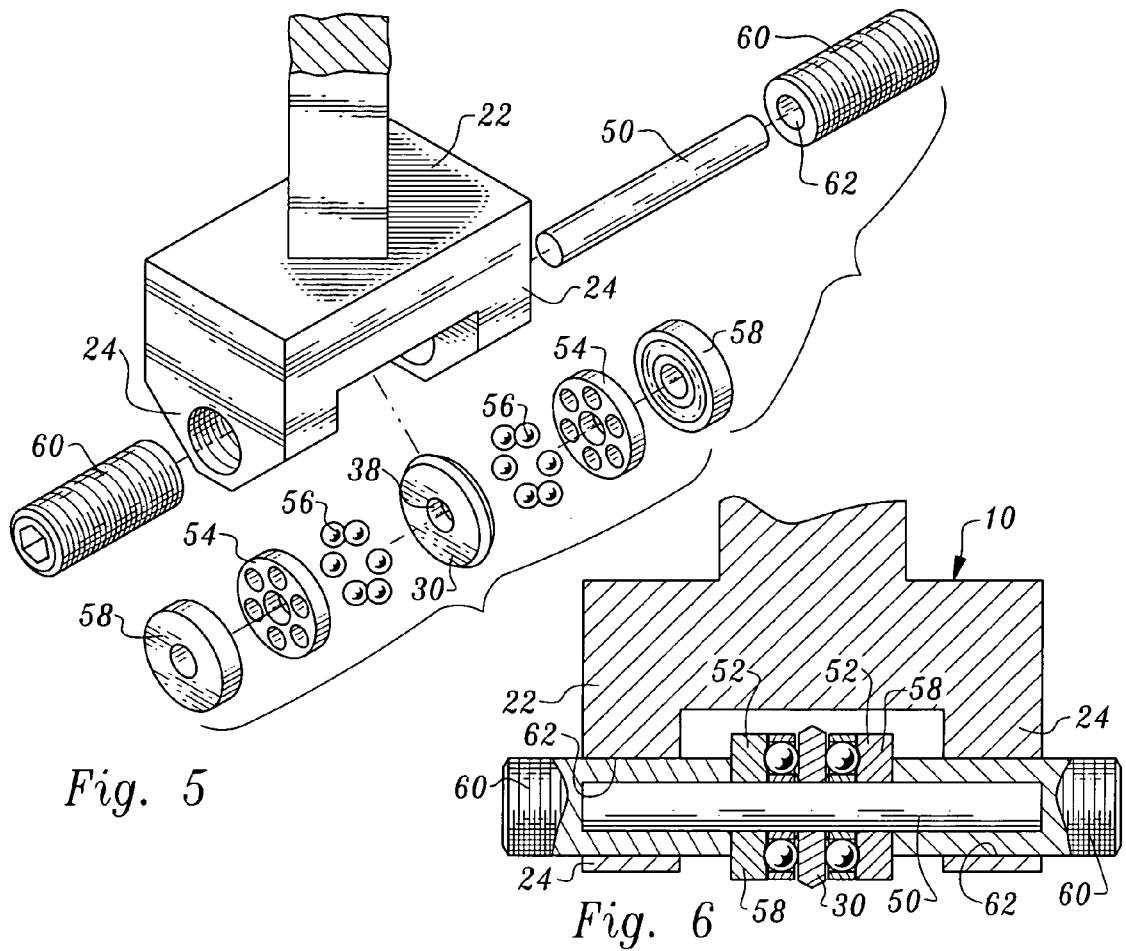
Fig. 5
Fig. 6
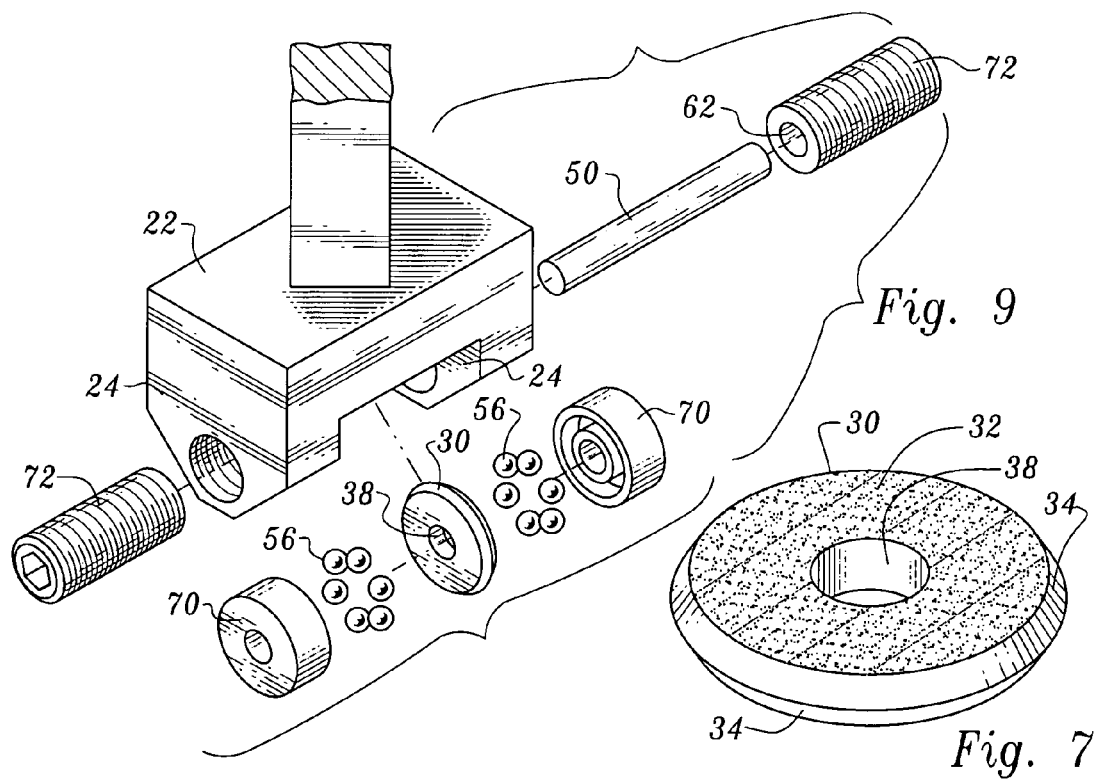
Fig. 9
Fig. 7

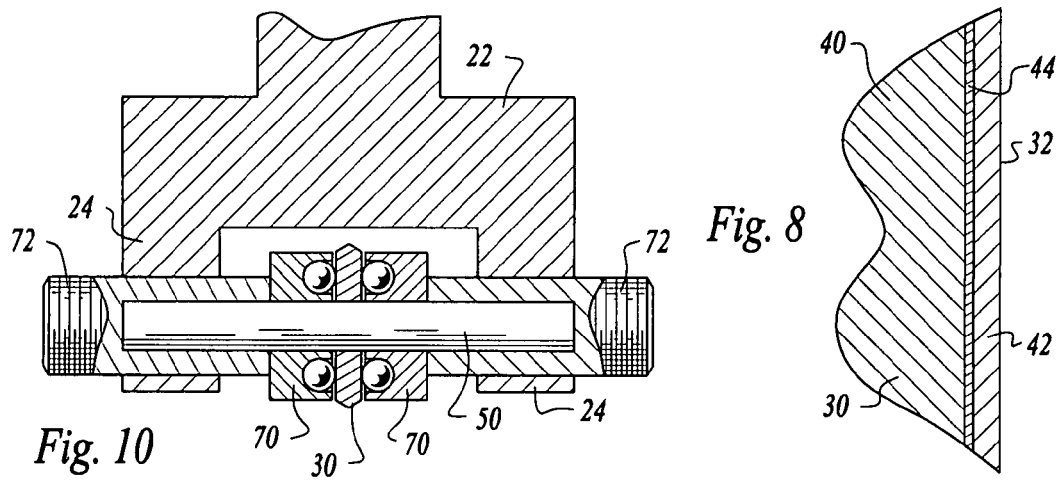
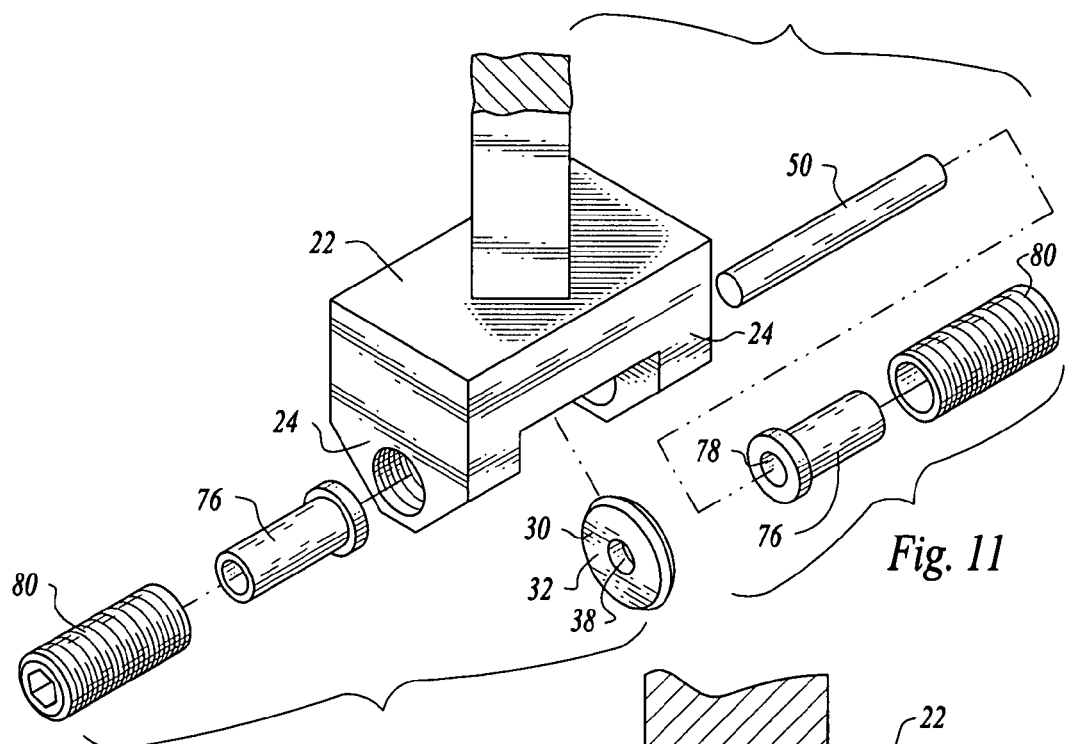
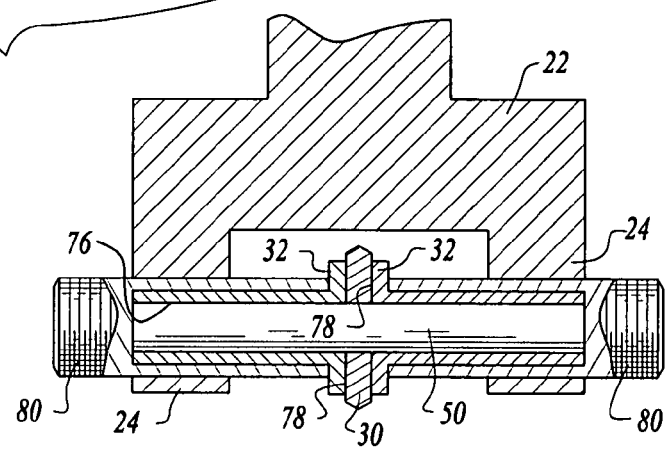

SCRIBING TOOL AND METHOD

TECHNICAL FIELD

This invention relates to the manufacture of semiconductor devices and circuits and more particularly to a tool and method for scribing semiconductor wafers.

BACKGROUND OF THE INVENTION

In the very early days of semiconductor device fabrication, the individual devices were separated from the other devices fabricated on the wafer by using the dicing process of scribing and breaking. The scribing process was carried out using a sharp-tipped diamond tool and initially done by hand. Later, automatic scribing machines such as those described in U.S. Pat. Nos. 3,094,785 and 5,820,006 were developed. These scribing machines provided a way to precisely position the diamond scribe tip as it traversed the width of the wafer and created the scribe line. This is necessary because the scribe line must stay within the scribe street that can be as narrow as 50 microns in width. Problems were observed with these scribe machines when hard semiconductor materials such as silicon were scribed. The diamond tips used in the machines would wear down quickly and have to be changed frequently at some expense. A new technology developed to dice these hard semiconductor materials using very thin saw blades made up of diamond particles embedded in a metal or resin matrix. Most silicon devices are currently diced using this sawing technology. The fact that the saw blade requires a wider scribe street due the width of the blade was generally not considered a problem, as silicon material is not too costly to produce. At this time, scribing with a sharp-tipped diamond tool is used primarily in niche applications in which the material is relatively soft so as not to cause a problem with diamond scribe tool life and in which the material is relatively expensive to produce. The materials that fit these criteria are generally compound semiconductors like gallium arsenide and indium phosphide.

For many decades, scribing and breaking of glass has been done using a wheel fabricated of steel or tungsten carbide. This wheel has an angle formed along its periphery that is pressed into the glass as it rolls along to create the scribe line. In the assembly of the scribe tool, the scribing wheel is mounted on an axle through a hole in its center. Then the axle and scribing wheel are placed in a tool body with holes on both sides to support the axle. The scribe tool is typically placed in a glass scribing machine similar to the one described in U.S. Pat. No. 4,221,150. In a glass scribing tool there are at least 50 to 100 microns clearance between the sides of the scribe of the scribe wheel and the inside of the yoke to allow the scribe wheel to turn freely. Therefore, when the scribe wheel tool traverses the glass to form the scribe line, the scribe wheel can move laterally back and forth between the inside edges of the yoke. This causes the scribe line to vary from a straight line by 50 to 100 microns. In glass scribing this variation is not considered a problem because the size of the scribed glass does not need to be held to any tighter tolerances.

In certain new types of semiconductor devices made out of silicon materials, the use of saws to dice wafers has proven to be unsatisfactory. In MEMS devices, the debris created by the sawing processing can prevent the mechanisms from operating properly. In very thin integrated circuits, such as those used in smart cards, the protruding diamond particles in the blade can cause chipping and fracturing of the device die. In trying to develop a process to dice these devices, conventional scribing using a sharp-tipped diamond tool was tried. While this approach solved the problem with debris and reduced chipping and fracturing, short diamond tool life when scribing a hard material like silicon is still a problem.

DISCLOSURE OF INVENTION

The purpose of this invention is to achieve longer tool life, while maintaining the advantages of scribing over sawing in certain applications. The invention encompasses a new scribing tool and a new method of scribing semiconductor wafers employing the tool.

The scribing tool is for use in semiconductor scribing apparatus for dicing semiconductor wafers. The scribing tool includes a tool body for movement relative to a semiconductor wafer, the tool body having a yoke with yoke legs defining a space therebetween.

A semiconductor wafer scribing wheel is located in the space having opposed scribing wheel sides and outer peripheral angularly disposed, converging scribed surfaces extending outwardly from the sides engageable with the semiconductor wafer to form scribed lines therein when the tool moves relative to the semiconductor wafer and exerts pressure thereon. The semiconductor wafer scribing wheel defines a central opening extending between the opposed scribing wheel sides.

An axle passes through the central opening and projects from the opposed scribing wheel sides, the axle cooperable with the yoke legs to rotatably support the semiconductor wafer scribing wheel within the space whereby the semiconductor wafer scribing wheel rotates when in engagement with the semiconductor wafer and the tool moves relative thereto.

Bearings are engageable with the opposed scribing wheel sides to resist sideways deflection of the semiconductor wafer scribing wheel during rotational engagement thereof with the semiconductor wafer.

The method of the invention includes the step of supporting a semiconductor wafer on a support.

A scribing tool is positioned above the supported semiconductor wafer, the scribing tool including a tool body having a yoke with yoke legs defining a space therebetween, a semiconductor wafer scribing wheel in the space and an axle having a longitudinal axis extending between the yoke legs and supporting the semiconductor wafer scribing wheel for rotation about a rotational axis coaxial with the longitudinal axis.

The method also includes the step of bringing the semiconductor wafer scribing wheel into engagement with the semiconductor wafer.

Pressure is exerted on the semiconductor wafer with the semiconductor wafer scribing wheel.

While maintaining the pressure on the semiconductor wafer with the semiconductor wafer scribing wheel, relative movement is caused between the scribing tool and the semiconductor wafer to move the semiconductor wafer scribing wheel across a surface of the semiconductor wafer while rotating the semiconductor wafer scribing wheel about the rotational axis to form a scribe line in the semiconductor wafer.

Other features, advantages and objects of the present invention will become apparent with reference to the following description and accompanying drawings.

BRIEF DESCRIPTION OF DRAWINGS

FIG. 1 is a perspective view of the scribing tool constructed in accordance with the teachings of the present invention incorporated in semiconductor scribing apparatus;

FIG. 2 is an enlarged, perspective view of the tool;

FIG. 3 is a top, plan view of the tool;

FIG. 4 is a side, elevational view of the tool;

FIG. 5 is an exploded, perspective view of the tool;

FIG. 6 is a greatly enlarged, cross-sectional view illustrating components of the tool;

FIG. 7 is an enlarged, perspective view of the semiconductor wafer scribing wheel of the tool;

FIG. 8 is a greatly enlarged, cross-sectional view showing a portion of the scribing wheel including a central core and scribing wheel side layers attached to the core;

FIG. 9 is a view similar to FIG. 5, but illustrating a second embodiment of the tool;

FIG. 10 is a view similar to FIG. 6, illustrating the second tool embodiment;

FIG. 11 is a view similar to FIGS. 5 and 9, but illustrating a third embodiment of the invention;

FIG. 12 is a view similar to FIGS. 6 and 10, illustrating the components of the third embodiment tool;

MODES FOR CARRYING OUT THE INVENTION

Figure 13:
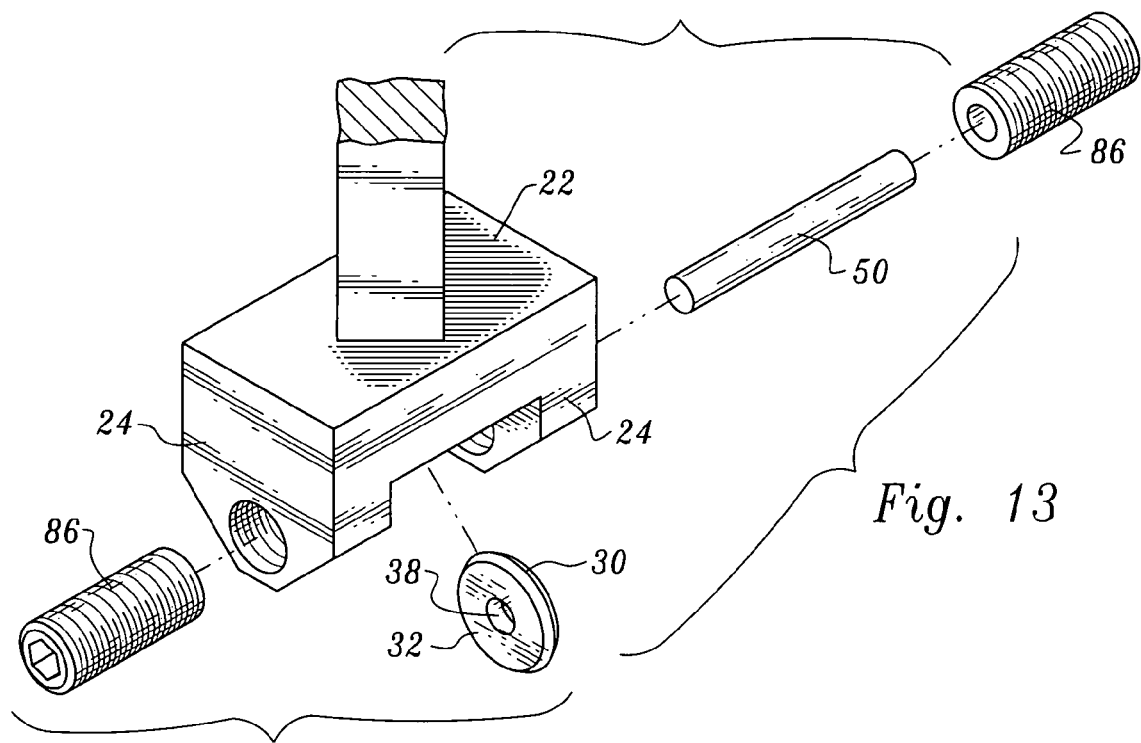
FIG. 13 is an exploded, perspective view of a fourth embodiment of the tool.

FIGS. 1-8 illustrate a scribing tool constructed in accordance with the teachings of the present invention. The scribing tool is designated by reference numeral 10 and in FIG. 1 the scribing tool is shown employed in a semiconductor scribing apparatus 12 for dicing semiconductor wafers. One such wafer, semiconductor wafer 14, is illustrated. The wafer is located on a support 16.

Co-pending U.S. patent application Ser. No. 10/462,398, filed Jun. 16, 2003, discloses a scribe tool supported by a multi-stage gantry, the multi-stage gantry operable to selectively bring the scribe tool into engagement with the wafer and to move the scribe tool relative to the wafer while in engagement therewith to form a scribe line in the wafer.

The arrangement shown in FIG. 1 incorporates such a multi-stage gantry, the latter identified by reference numeral 18. It is to be appreciated, however, that the tool of the present invention may be utilized and the method of the present invention practiced utilizing any suitable type of scribing tool transport mechanism.

Scribing tool 10 includes a tool body 20 for movement relative to the semiconductor wafer 14. The tool body has a yoke 22 with yoke legs 24 defining a space therebetween.

A semiconductor wafer scribing wheel 30 is located in the space defined by the yoke legs, the scribing wheel having opposed scribing wheel sides 32 and outer peripheral angularly disposed, converging scribe surfaces 34 (see FIG. 7) extending outwardly from the sides engageable with the semiconductor wafer to form scribe lines, such as scribe line 36 shown in FIG. 1, therein when the tool moves relative to the semiconductor wafer and exerts pressure thereon. The semiconductor wafer scribing wheel defines a central opening 38 extending between the opposed scribing wheel sides.

The wheel employed when practicing this invention is a unique modification of a commercially available glass scribing wheel made available by Toyo Industrial Company Limited of Osaka, Japan. The unmodified commercially available wheel suitable for cutting glass is comprised of silicon carbide particles held together by a binder.

Scribing wheel 30 has a structure which may best be seen with reference to FIGS. 7 and 8. Scribing wheel 30 has an inner wheel core 40 of silicon carbide and binder scribing wheel side layers are affixed to the inner scribing wheel core 40. Each scribing wheel side layer is of multi-laminate construction, including an outer laminate 42 of nickel, chrome or other comparably hard metal and an inner layer 44, preferably of titanium. The titanium improves adhesion between the outer laminate 42 and the scribing wheel core. Shedding of abrasive silicon carbide particles is prevented at the sides of the scribing wheel core. The scribing edges on the periphery of the scribing wheel core are masked when being modified in accordance with the teachings of the present invention and a layer or laminate 44 of titanium a few microns thick is plated on the sides of the wheel. Then, on top of the layer of titanium, the outer laminate or layer of tough and resistant metal, such as nickel or chrome, is plated to a thickness of around 50 microns. The two scribing wheel sides are then lapped flat and parallel to a tolerance of from about 1 to 2 microns using conventional lapping equipment.

An axle or shaft 50 passes through central opening 38 and projects from the opposed scribing wheel sides 32. The axle is cooperable with the yoke legs to rotatably support the semiconductor wafer scribing wheel within the space defined by the yoke legs whereby the semiconductor wafer scribing wheel rotates when in engagement with the semiconductor wafer and the tool moves relative thereto.

Bearings are engageable with the opposed scribing wheel sides to resist sideways deflection of the semiconductor wafer scribing wheel during rotational engagement thereof with the semiconductor wafer. In the arrangement of FIGS. 1-8, the bearings are identified by reference numeral 52. Each bearing is a rotary thrust bearing comprising a thrust bearing retainer 54, ball bearings 56 positioned in the thrust bearing retainer in engagement with a scribing wheel side and a thrust bearing plate 58 on a side of the ball bearings opposed to the scribing wheel side engaged thereby. The ball bearings are disposed in the two thrust bearing retainers and held in place during assembly by a light, inert grease, such as Krytox GPL 205 manufactured by DuPont Company. This grease also serves to lubricate the ball bearings during operation of the tool. After the scribing wheel 30 and the bearings 52 have been placed on the axle, the assembly is placed inside the yoke.

The tool includes bearing load adjustment structure in operative association with the bearings to move the bearings toward or away from the semiconductor wafer scribing wheel. In the arrangement of FIGS. 1-8, the bearing load adjustment structure comprises adjustment screws 60. A small amount of low-strength, thread locking compound, such as Loctite 222 is placed on the threads of the bearing load adjustment screws and the adjustment screws 60 are screwed into the two sides of the tool body, the ends of the axle being carefully guided into the cavities or holes 62 of the adjustment screws. The bearing load adjustment screws are then tightened to achieve the desired bearing clearance.

After assembly of the scribing tool is completed, it is mounted on a scribing machine such as that shown in FIG. 1 and identified by reference number 12.

The scribing process carried out using the new tool is considerably different from a similar process carried out using a sharp-tipped diamond tool. The scribe wheel tool has a much larger contact area with the surface of the wafer than the sharp-tipped diamond tool point. This allows the application of increased force to the surface of the wafer resulting in the creation of stress much deeper in the wafer without creating surface damage. This gives a scribe line with less chipping due to damage on the surface of the wafer and a scribe line that is easier to break due to an increase in the amount and the depth of stress in the body of the wafer under the scribe line.

The process parameters to achieve the best scribing results depend on the diameter of the scribing wheel, the angle of the wheel's scribe surfaces 34, the amount of force applied to the tool by the scribing machine, and the material being scribed. For silicon material, the wheel size can range from about 2 mm to about 10 mm in diameter with the larger wheels requiring more force to achieve the desired results. The angles of the wheel's scribe surfaces can vary from around 80 degrees to around 150 degrees. In tests best results on silicon using a 4 mm diameter wheel were obtained using wheels with angles of 140 degrees to 150 degrees and a force of 350-400 grams. A further advantage of the new tool is that the scribing can be carried out at a higher velocity than with a sharp-tipped diamond tool. Conventional diamond scribers are usually limited to a velocity of around 100 mm/sec. Tests have shown that the scribing tool of this invention will scribe at velocities of at least 800 mm/sec.

The method of the invention includes the step of supporting a semiconductor wafer on a support.

A scribing tool is positioned above the supported semiconductor wafer, the scribing tool including a tool body having a yoke with yoke legs defining a space therebetween, a semiconductor wafer scribing wheel in the space and an axle having a longitudinal axis extending between the yoke legs and supporting the semiconductor wafer scribing wheel for rotation about a rotational axis co-axial with the longitudinal axis.

The semiconductor wafer scribing wheel is brought into engagement with the semiconductor wafer.

Pressure is exerted on the semiconductor wafer with the semiconductor wafer scribing wheel. While maintaining the pressure on the semiconductor wafer with the semiconductor wafer scribing tool, relative movement is caused between the scribing tool and the semiconductor wafer to move the semiconductor wafer scribing wheel across a surface of the semiconductor wafer while rotating the semiconductor wafer scribing wheel about the rotational axis to form a scribe line in the semiconductor wafer.

Opposed sides of the semiconductor wafer scribing wheel are engaged with bearings to resist sideways deflection of the semiconductor wafer scribing wheel.

The semiconductor wafer scribing wheel is adjustably moved to a desired predetermined location relative to the yoke prior to bringing the semiconductor wafer scribing wheel into engagement with the semiconductor wafer. Movement of the semiconductor wafer scribing wheel is accomplished by changing positions of the bearings relative to the yoke.

FIGS. 9 and 10 show an alternative embodiment of the invention. The axle 50 is inserted through the central opening 38 in the scribing wheel 30. The ball bearings 56 are placed into ball bearing plates 70 and held in place during assembly by a light, inert grease, such as Krytox GPL 205 manufactured by DuPont Company. In addition, this grease serves to lubricate the ball bearings during operation of the tool. The two ball bearing plates 70, with the ball bearings 56 are placed on the axle 50 on both sides of the semiconductor wafer scribing wheel 30. This assembly is placed inside the yoke 22 of the tool body. A small amount of low-strength, thread locking compound, such as Loctite 222, is placed on the threads of the bearing load adjustment screws 72. The bearing load adjustment screws are screwed into the two sides of the tool body and the ends of the axle are carefully guided into the cavities in the ends of the bearing load adjustment screws. Finally, the bearing load adjustment screws are tightened to achieve the desired bearing clearance.

FIGS. 11 and 12 illustrate a third embodiment of the scribing tool. In this embodiment, double-ended bushings 76 are positioned on and surround the axle 50. The bushings have scribing wheel side engagement surfaces 78 at the inner, opposing ends thereof. Adjustment screws 80 surround the bushings 76 and are threadedly engaged with the yoke legs 24. A small amount of low-strength, thread locking compound, such as Loctite 222, is placed on the threads of the adjustment screws prior to threaded engagement with the yoke legs. The adjustment screws are tightened to achieve the desired clearance between the double-ended bushings 76 and the scribing wheel 30.

Figure 14:
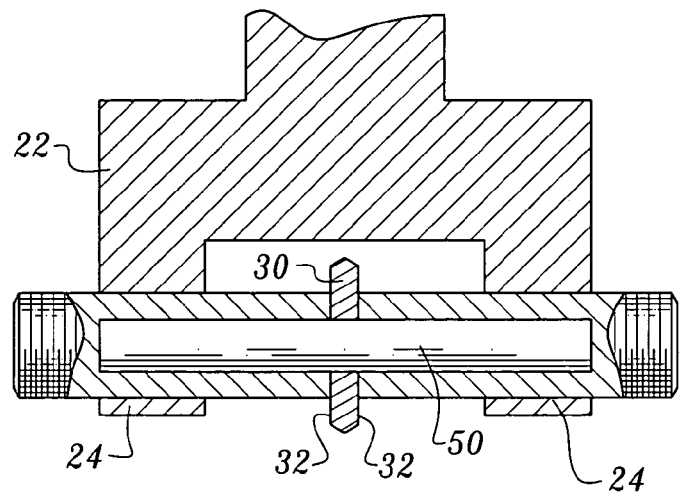
FIG. 14 is an enlarged, cross-sectional view of the components of the fourth tool embodiment.

FIGS. 13 and 14 show a fourth scribing tool embodiment. In this embodiment threaded double-ended bushings 86 are employed and surround the axle 50 on opposed sides of the scribing wheel 30. The bushings 86 are threadedly engaged with the yoke legs 24 and the inner ends of the bushings constitute bearing surfaces engageable with the sides of the scribe wheel. A socket opening is defined at the outermost ends of the bushings 86 to allow adjustment in the positioning thereof. A small amount of low-strength, thread locking compound is preferably applied to the threads of the bushings 86 prior to threading engagement with the yoke to maintain the bushings and scribing wheel in position.

The invention claimed is:

1. A method for scribing semiconductor wafers, said method comprising the steps of:

supporting a semiconductor wafer on a support;

positioning a scribing tool above the supported semiconductor wafer, said scribing tool including a tool body having a yoke with yoke legs defining a space therebetween, a semiconductor wafer scribing wheel in said space and an axle having a longitudinal axis extending between said yoke legs and supporting said semiconductor wafer scribing wheel for rotation about a rotational axis co-axial with said longitudinal axis;

bringing said semiconductor wafer scribing wheel into engagement with said semiconductor wafer;

exerting pressure on said semiconductor wafer with said semiconductor wafer scribing wheel;

while maintaining pressure on said semiconductor wafer with said semiconductor wafer scribing tool, causing relative movement between said scribing tool and said semiconductor wafer to move said semiconductor wafer scribing wheel across a surface of said semiconductor wafer while rotating said semiconductor wafer scribing wheel about said rotational axis to form a scribe line in said semiconductor wafer;

engaging opposed sides of said semiconductor wafer scribing wheel with bearings to resist sideways deflection of said semiconductor wafer scribing wheel; and adjustably moving the semiconductor wafer scribing wheel within said space to a desired predetermined location relative to said yoke legs prior to bringing said semiconductor wafer scribing wheel into engagement with said semiconductor wafer, movement of said semiconductor wafer scribing wheel accomplished by changing positions of said bearings relative to said yoke.

2. A scribing tool for use in semiconductor scribing apparatus for dicing semiconductor wafers, said scribing tool comprising, in combination:

a tool body for movement relative to a semiconductor wafer, said tool body having a yoke with yoke legs defining a space therebetween;

a semiconductor wafer scribing wheel located in said space having opposed scribing wheel sides with lapped flat surfaces and outer peripheral, angularly disposed, converging scribe surfaces extending outwardly from said sides engageable with the semiconductor wafer to form scribe lines therein when said tool moves relative to said semiconductor wafer and exerts pressure thereon, said semiconductor wafer scribing wheel defining a central opening extending between said opposed scribing wheel sides;

an axle passing through said central opening and projecting from the opposed scribing wheel sides cooperable with said yoke legs to rotatably support said semiconductor wafer scribing wheel within said space whereby said semiconductor wafer scribing wheel rotates when in engagement with the semiconductor wafer and said tool moves relative thereto;

thrust bearings engageable with the lapped flat surfaces of said opposed scribing wheel sides to resist sideways deflection of said semiconductor wafer scribing wheel during rotational engagement thereof with the semiconductor wafer; and bearing load adjustment structure in operative association with each of said thrust bearings to move said thrust bearings toward or away from said semiconductor wafer scribing wheel.

3. The scribing tool according to claim 1 wherein said thrust bearings comprise rotary thrust bearings.

4. The scribing tool according to claim 3 wherein each rotary thrust bearing comprises a thrust bearing retainer, ball bearings positioned in said thrust bearing retaining in engagement with a scribing wheel side and a thrust bearing plate on a side of the ball bearings opposed to the scribing wheel side engaged thereby.

5. The scribing tool according to claim 4 wherein said bearing load adjustment structure comprises adjustment screws threadedly engaged with said tool body and having screw ends engaging said thrust bearing plates.

6. The scribing tool according to claim 3 wherein the rotary bearings are ball bearing plates holding ball bearings positioned on said axle and wherein a ball bearing plate and ball bearings held thereby are positioned at each of said opposed scribing wheel sides with the ball bearings engaging said opposed scribing wheel sides.

7. The scribing tool according to claim 6 wherein said bearing load adjustment structure comprises adjustment screws threadedly engaged with said tool body and having screw ends engaging said ball bearing plates.

8. The scribing tool according to claim 7 wherein said adjustment screws define cavities receiving opposed ends of said axle to support said axle, said semiconductor wafer scribing wheel and said rotary bearings.

9. The scribing tool according to claim 1 wherein said bearings comprise double-ended bushings positioned on and surrounding said axle and having scribing wheel side engagement surfaces at inner ends thereof.

10. The scribing tool according to claim 9 additionally comprising bearing load adjustment structure in operative association with said double-ended bushings to move said double-ended bushings toward or away from said semiconductor wafer scribing wheel.

11. The scribing tool according to claim 10 wherein said bearing load adjustment structure comprises adjustment screws engaging said double-ended bushings.

12. The scribing tool according to claim 10 wherein said bearing load adjustment structure comprises mating threads on said double-ended bushings and on said yoke.

13. The scribing tool according to claim 1 additionally comprising locking means for locking said thrust bearings against movement after said bearing load adjustment structure has moved said thrust bearings relative to said semiconductor wafer scribing wheel.

14. The scribing tool according to claim 13 wherein said locking means comprises locking compound applied to said bearing load adjustment structure and said yoke.

15. The scribing tool according to claim 1 wherein said semiconductor wafer scribing wheel includes an inner scribing wheel core and scribing wheel side layers attached to said inner scribing wheel core.

16. The scribing tool according to claim 15 wherein each said scribing wheel side layer is of multi-laminate construction, including on outer laminate of nickel or chrome or other hard metal and an inner layer.

17. The scribing tool according to claim 16 wherein said inner layer is titanium.

18. A scribing tool for use in semiconductor scribing apparatus for dicing semiconductor wafers, said scribing tool comprising, in combination:

a tool body for movement relative to a semiconductor wafer, said tool body having a yoke with yoke legs defining a space therebetween;

a semiconductor wafer scribing wheel located in said space having opposed scribing wheel sides and outer peripheral, angularly disposed, converging scribe surfaces extending outwardly from said sides engageable with the semiconductor wafer to form scribe lines therein when said tool moves relative to said semiconductor wafer and exerts pressure thereon, said semiconductor wafer scribing wheel defining a central opening extending between said opposed scribing wheel sides;

an axle passing through said central opening and projecting from the opposed scribing wheel sides cooperable with said yoke legs to rotatably support said semiconductor wafer scribing wheel within said space whereby said semiconductor wafer scribing wheel rotates when in engagement with the semiconductor wafer and said tool moves relative thereto;

bearings engageable with said opposed scribing wheel sides to resist sideways deflection of said semiconductor wafer scribing wheel during rotational engagement thereof with the semiconductor wafer; and bearing load adjustment structure in operative association with said bearings to move said bearings toward or away from said semiconductor wafer scribing wheel, said bearings comprising rotary thrust bearings, a rotary thrust bearing positioned at each of said opposed scribing wheel sides and engageable therewith, each rotary thrust bearing comprising a thrust bearing retainer, ball bearings positioned in said thrust bearing retainer in engagement with a scribing wheel side and a thrust bearing plate on a side of the ball bearings opposed to the scribing wheel side engaged thereby, and said bearing load adjustment structure comprising adjustment screws threadedly engaged with said tool body and having screw ends engaging said thrust bearing plates.

19. The scribing tool according to claim 18 wherein said adjustment screws define cavities receiving opposed ends of said axle to support said axle, said semiconductor scribing wheel and said rotary thrust bearings.

20. A scribing tool for use in semiconductor scribing apparatus for dicing semiconductor wafers, said scribing tool comprising, in combination:

a tool body for movement relative to a semiconductor wafer, said tool body having a yoke with yoke legs defining a space therebetween;

a semiconductor wafer scribing wheel located in said space having opposed scribing wheel sides and outer peripheral, angularly disposed, converging scribe surfaces extending outwardly from said sides engageable with the semiconductor wafer to form scribe lines therein when said tool moves relative to said semiconductor wafer and exerts pressure thereon, said semiconductor wafer scribing wheel defining a central opening extending between said opposed scribing wheel sides;

an axle passing through said central opening and projecting from the opposed scribing wheel sides cooperable with said yoke legs to rotatably support said semiconductor wafer scribing wheel within said space whereby said semiconductor wafer scribing wheel rotates when in engagement with the semiconductor wafer and said tool moves relative thereto;

bearings engageable with said opposed scribing wheel sides to resist sideways deflection of said semiconductor wafer scribing wheel during rotational engagement thereof with the semiconductor wafer; and bearing load adjustment structure in operative association with said bearings to move said bearings toward or away from said semiconductor wafer scribing wheel, said bearing load adjustment structure comprising adjustment screws.

* * * * *